(12) United States Patent
Ye et al.

(10) Patent No.: US 9,945,399 B2
(45) Date of Patent: Apr. 17, 2018

(54) LIQUID-DRIVEN NANO-POROUS ACTUATOR AND THE APPLICATION THEREOF

(71) Applicant: INSTITUTE OF METAL RESEARCH CHINESE ACADEMY OF SCIENCES, Liaoning (CN)

(72) Inventors: Xinglong Ye, Liaoning (CN); Lingzhi Liu, Liaoning (CN); Haijun Jin, Liaoning (CN)

(73) Assignee: INSTITUTE OF METAL RESEARCH, CHINESE ACADEMY OF SCIENCES, Shenyang, Liaoning (CN)

( * ) Notice: Subject to any disclaimer, the term of this patent is extended or adjusted under 35 U.S.C. 154(b) by 327 days.

(21) Appl. No.: 14/764,824

(22) PCT Filed: Sep. 26, 2014

(86) PCT No.: PCT/CN2014/087483
§ 371 (c)(1),
(2) Date: Jul. 30, 2015

(87) PCT Pub. No.: WO2015/106583
PCT Pub. Date: Jul. 23, 2015

(65) Prior Publication Data
US 2015/0361997 A1 Dec. 17, 2015

(30) Foreign Application Priority Data

Jan. 20, 2014 (CN) .......................... 2014 1 0024034

(51) Int. Cl.
*B81B 3/00* (2006.01)
*F15B 15/08* (2006.01)

(52) U.S. Cl.
CPC ............ *F15B 15/08* (2013.01); *B81B 3/0032* (2013.01); *B81B 2201/038* (2013.01); *Y10T 29/49828* (2015.01)

(58) Field of Classification Search
CPC ............................... B81B 3/0032; F15B 15/08
See application file for complete search history.

(56) References Cited

U.S. PATENT DOCUMENTS

| 7,799,416 B1 | 9/2010 | Chan et al. |
| 2010/0006209 A1 | 1/2010 | Femmer |

FOREIGN PATENT DOCUMENTS

| CN | 102321271 A | 1/2012 |
| CN | 103256333 A | 8/2013 |

(Continued)

OTHER PUBLICATIONS

Machine translation of CN103256333A, accessed Aug. 17, 2017.*

(Continued)

*Primary Examiner* — Jonathan Matthias
(74) *Attorney, Agent, or Firm* — Smith, Gambrell & Russell, LLP

(57) ABSTRACT

The present invention discloses a liquid-driven nano-porous actuator and the application thereof, and belongs to the field of nano material actuators. According to the present invention, by changing the content of the liquid in the nano-porous material, the interface between the surface liquid of the nano-porous material and air is exchanged between flat and curved states, so as to change the compressive stress acting on the nano-porous material from the surface tension of the liquid and change the elastic deformation of the nano-porous material, thus driving the nano-porous material to contract and expand in a reversible manner and further realizing driving performance. The actuator features simple and easy implementation and environmental-friendly effect without the need of external physical excitation signals (Continued)

(a)

Reduce Liquid
Increase Liquid (b)

(light, magnetic field, electricity or heat), complicated external excitation process, conversion of electric, magnetic, and light energy, chemical or electrochemical process, or toxic, harmful or corrosive chemical substances, and it is especially suitable for bio-robot, medical and aerospace fields.

18 Claims, 6 Drawing Sheets

(56) References Cited

FOREIGN PATENT DOCUMENTS

| JP | 2009291758 A | 12/2009 |
|----|--------------|---------|
| WO | 2005063379 | 7/2005 |

OTHER PUBLICATIONS

International Search Report for PCT/CN2014/087483, dated Dec. 19, 2014 in English & Chinese Language.
Science, dated Apr. 11, 2003. Charge-Induced Reversible Strain in a Metal, vol. 300, pp. 312-315/ J. Weissmuller, R.N. Viswanath, D. Kramer, P. Zimmer, R. Wurschum, H. Gleiter.
Nature Materials, dated Jan. 2009, Surface-chemistry-driven actuation in nanoporous gold, vol. 8, pp. 47-51/ J. Biener, A. Wittstock, L. A. Zepeda-Ruiz, M. M. Biener, V. Zielasek, D. Kramer, R. N. Visawanath, J. Wiessmuller, M. Baumer, A. V. Hamza.

* cited by examiner

LIQUID-DRIVEN NANO-POROUS ACTUATOR AND THE APPLICATION THEREOF

TECHNICAL FIELD

The present invention relates to the technical field of actuators of nano materials, specifically to a liquid-driven nano-porous actuator and the application thereof.

DESCRIPTION OF THE RELATED ART

The materials capable of sensing external excitation signals and responding to change their own shape or size can convert other forms of external energy into mechanical energy and realize driving performance, and thus such smart materials are often used as actuators. The smart materials commonly used include shape memory alloys, piezoelectric materials, and magnetostrictive materials, as well as electroactive conducting polymers, carbon nano-tubes, and nano-porous metal materials developed in recent years. The general characteristics of these smart materials used as actuators lie in that they may respond to external physical or chemical excitation signals and convert external energy like heat, electricity, or chemical energy into mechanical energy. Over the last decade, nano-porous metals used as a new type of actuator have drawn increasing attention. Nano-porous metals, consisted of a solid phase and a porous phase interconnected in 3D space, have a specific surface area as high as 10 m$^2$/g. The basic principles of nano-porous metals used as an actuator are as below: the internal stress of the solid phase is changed by changing the surface stress of the solid phase in nano-porous metals so as to further drive the nano-porous metal to contract or expand and realize driving performance. Because the solid phase in nano-porous metals is at the nanoscale, compared with a macroscopic solid, the change of the internal stress of the solid phase caused by the surface stress is enlarged, which is the reason why nano-porous metals give rise to macroscopically visible expansion or contraction. The problem of how to change the surface stress of the solid phase is generally solved by changing the surface charge state of the solid phase in a nano-porous metal through a chemical or electrochemical method in the existing literature. For instance, Weissmuller et al disclosed that about 0.15% of reversible strain amplitude can be obtained by soaking nano-porous platinum into 1 M HClO$_4$ solution and then controlling the potential applied on the nano-porous platinum [J. Weissmuller, N. Viswanath, D. Kramer, P. Zimmer, R. Wurschum, and H. Gleiter, Science 300, 312 (2003)]. Biener et al disclosed that as high as 0.5% of reversible actuation amplitude can be obtained by introducing gases of CO and O$_3$ alternately into nano-porous gold and making the surface of nano-porous gold oxidize or deoxidize repeatedly [J. Biener, A. Wittstock, L. A. Zepeda-Ruiz, M. M. Biener, V. Zielasek, D. Kramer, R. N. Viswanath, J. Weismuller, M. Baumer and A. V. Hamza, Nature Mater. 8, 47 (2009)]. However, the above-mentioned electrochemical or chemical driving methods have obvious defects: an electrochemical or chemical method is only suitable for nano-porous materials whose solid phase is conducting material; due to the impact on a nano structure caused by an electrochemical or chemical process, for example, the solid phase coarsened or crept, an electrochemical or chemical driving method may cause poor actuating reversibility and irreversible contraction; in view of the application, an electrochemical or chemical driving method involves corrosive electrolytes, reference electrodes, arrangement of electrodes, allocation of electrical equipment or harmful, corrosive gases and complicated external excitation methods, which leads to great trouble to the combination of the actuator with other devices and makes the actuator dangerous because of the presence of corrosive electrolytes or gases, thus causing damage to the environment and making protective work more difficult. These unfavorable factors are the chief obstacle to putting these actuators into practice. Therefore, to develop an actuator not involving corrosive electrolytes or harmful gases, without the need of a complicated driving or excitation mode or the need of an electrochemical or chemical process has great application value.

BRIEF SUMMARY OF THE INVENTION

To overcome the problems that the traditional nano-porous actuator requiring a complicated external excitation mode, such as the participation of an electrochemical process or chemical reaction, the use of magnetic or electric fields and the involvement of corrosive media, harmful and toxic gases in the driving process, the present invention puts forward a liquid-driven nano-porous actuator and the application thereof, wherein the actuator boasts a simple and environmental-friendly excitation mode, non-involvement of corrosive media or other harmful materials in the actuator's operation, environmental-friendly and simple application, and easy assembly into devices.

To realize the objectives above, the present invention employs the following technical solution:

a liquid-driven nano-porous actuator comprises a base material and a liquid for driving; the base material is fully or partly nano-porous material, wherein the porous structure of the nano-porous material is an open-porous structure, namely, interconnected in 3D space; the liquid for driving is filled in the pores of the nano-porous material, and by changing the content of the liquid in the nano-porous material, the interface between the surface liquid of the nano-porous material and air is exchanged between flat and curved states, so as to change the compressive stress acting on the nano-porous material from the surface tension of the liquid and change the elastic deformation of the nano-porous material, thus driving the nano-porous material to contract and expand in a reversible manner and further realizing driving performance.

The pore diameter of the nano-porous material is at the nanoscale (even or uneven pore diameter). Moreover, there is no crack inside, which leads to the nano-porous actuator being able to bear external loads without damaging its structure.

The nano-porous material is selected from metal, ceramics, or polymer materials, and prepared through an electrochemical de-alloying method, chemical free corrosion method, metal anodization method, template method, solid sintering method, or sol-gel method.

The driving force of the actuator can be adjusted by changing the pore diameter of the nano-porous material or filling liquids of different surface tensions in the nano-porous material. Water, alcohol, sodium nitrate or metal melt may be used according to the actual demands.

When the base material of the actuator is partly nano-porous material, the remaining part shall be solid material. The nano-porous material and the solid material are compounded into a bilayer composite structure, multi-layer composite structure or the nanoporous shell-solid core structure.

The liquid filled in the nano-porous material and the pore wall of the nano-porous material shall be wetted, and shall not have any interaction, chemical reaction, or damage the pore wall.

The actuator is used to prepare devices capable of exchanging between two shapes by changing the content of the liquid, namely devices having a memory effect, for example: used to make artificial muscle, cardiovascular stents, or tube connectors.

The principles of the present invention are as follows:

the liquid-driven nano-porous actuator according to the present invention uses an innovative driving mode, specifically, filling a liquid into the pores of the interconnected nano-porous material and changing the content of the liquid in the pores of the nano-porous material to make it less or more than the volume of the liquid capable of being contained by the pore space in nanoporous material so as to exchange the interface between the surface liquid of the nano-porous material and air between flat and curved states and increase or reduce the additional pressure acting on the nano-porous material from the surface tension of the liquid, thus changing the elastic strain of the nano-porous material and driving the nano-porous material to contract and expand in a reversible manner, finally realizing driving performance.

The present invention has the following advantages:

1. The actuator according to the present invention features simple and easy implementation and an environmental-friendly effect without the need for external physical excitation signals (light, magnetic field, electricity or heat), complicated external excitation process, conversion of electric, magnetic, and light energy, chemical or electrochemical process, or toxic, harmful or corrosive chemical substances, and it is especially suitable for bio-robots, medical, and aerospace fields.

2. In the embodiments of the present invention, the driving amplitude of the nano-porous Au—Pt actuator driven by water exceeds 1.2%, the maximum driving stress is 23 MPa, the maximum strain response speed is 0.30% and the contraction and expansion are completely reversible.

DETAILED DESCRIPTION OF THE INVENTION

The technical solution to the present invention is further detailed in combination with the embodiments and the drawings below.

The present invention involves a nano-porous actuator driven on the basis of the surface tension of the liquid and the application thereof, wherein the base material of the actuator is a nano-porous material, the pore structure is an open porous structure, namely, the pores in the nano-porous material are interconnected in 3D space. The nano-porous material can be prepared by, but not limited to, the following methods: electrochemical de-alloying method, chemical free corrosion method, metal anodization method, template method, solid sintering method, and sol-gel method. The nano-porous material is made from a metal, ceramic, or polymer material. The driving performance is realized by, specifically, filling a liquid into the pores of the interconnected nano-porous material and changing the content of the liquid in the pores of the nano-porous material to make it more or less than the volume of the liquid capable of being contained so as to exchange the interface between the liquid and air between flat and curved states and reduce or increase the additional pressure acting on the nano-porous material from the surface tension of the liquid, thus changing the size of the elastic deformation of the nano-porous material and driving the nano-porous material to contract and expand in a reversible manner. The liquid filled in the nano-porous material shall wet the pore wall of the nano-porous material, and shall not have any chemical interaction, chemical reaction with, or damage the pore wall. Liquids of different surface tensions may be selected according to actual demands, including, but not limited to: water, alcohol, sodium nitrate, and metal melt.

Figure 1:
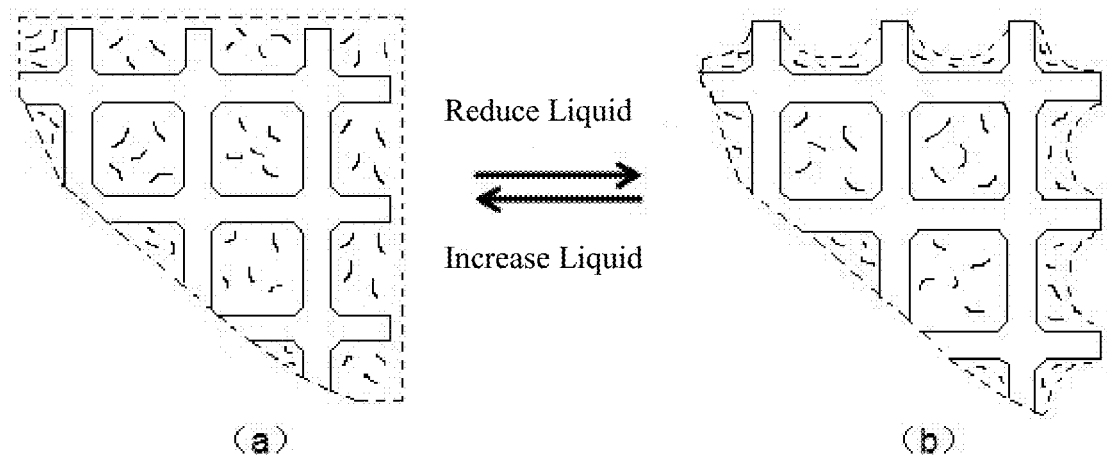
FIG. 1 is the diagram showing the driving principle of the nano-porous actuator driven on the basis of the surface tension of the liquid; in the figure, (a) the content of the liquid in the pores is more than the volume of the liquid capable of being contained, and (b) the content of the liquid in the pores is less than the volume of the liquid capable of being contained.

FIG. 1 is the diagram showing the principle of the nano-porous actuator driven by liquid: the nano-porous material is an open pore structure capable of containing liquid of a certain volume. As shown in FIG. 1(a), when the nano-porous material is filled with liquid, there will be excessive liquid on the surface of the nano-porous material, the contacting interface between the liquid and air is flat and the internal pressure of the liquid is equal to the external atmospheric pressure. When the volume of the liquid (for example, due to volatilization) is reduced to become less than the volume that the nano-porous material can contain, as shown in FIG. 1(b), the liquid will cave into the pores of the nano-porous material so as to form a liquid-air interface with negative curvature. At this time, with the presence of additional pressure of the curved liquid-air interface, the internal pressure inside the liquid is smaller than the external atmospheric pressure by $\Delta P = 2\gamma \cos\theta/r$, wherein $\gamma$ is the surface tension of the liquid, $\theta$ is the wetting angle of the liquid on the pore wall of the nano-porous material and r is the pore diameter. The sum of the internal stresses of the nano-porous material and the liquid filled inside as a system is zero, while the interior of the liquid is negative pressure. To balance the negative pressure (actually, the liquid is equivalent to being under tensile stress), the nano-porous material will undergo compressive elastic deformation until the sum of the negative pressures of the liquid is offset by the sum of the compressive stresses caused by elastic deformation. Otherwise, when the content of liquid in the state of FIG. 1(b) is increased to the state shown in FIG. 1(a), the curved liquid-air interface disappears, and the negative pressure inside the liquid disappears. At this time, the nano-porous material does not need to balance the negative pressure inside the liquid, the compressive elastic deformation disappears and the original size is restored. It can be concluded that, compared with the nano-porous material fully soaked in the liquid or fully dried, the pressure withstood by the nano-porous material with a concave liquid surface is $V_{pore}\Delta p$, wherein $V_{pore}$ is the porosity of the nano-porous material. The exchange between the flat and curved states of the nano-porous material at the surface liquid-air interface allows the compressive stress withstood by the nano-porous material to change, further leading to the change of the elastic strain of the nano-porous material, which is the basic principle of the surface tension of the liquid driving the nano-porous material to make reversible contraction and expansion. The strain amplitude of the nano-porous material driven by the liquid $\Delta l/l_0$ can be obtained by Hooke's law, namely $\Delta p V_{pore}/3K$, wherein K is the bulk modulus of the nano-porous material.

Example 1

The base material of the nano-porous actuator driven by liquid in this example is nano-porous Au—Pt and the filled liquid is water. The method for preparing the nano-porous Au—Pt base is as follows: prepare Pt—Au—Ag alloy with molar ratio of 1.25:23.75:75 by repetitive arc melting, and then anneal the alloy ingot for 100 h at 850° C. for homogenization, compress it to 1.5 mm thick, and then out to rectangular samples of 1.2 mm×1.2 mm×1.5 mm; afterwards, put the rectangular samples of Au—Ag—Pt alloy on the working electrodes of a three-electrode system, control the electrochemical station to apply 1.035 V on the working electrodes to dealloy the alloy for 50 h. In the three-electrode system, the counter electrode is pure silver wires, the reference electrode is a saturated calomel electrode and the electrolyte is 1 M HClO$_4$ solution. After dealloying, scan the potential applied on the working electrode to 1.35 V at a speed of 10 µV/s in the positive direction, and then scan to 1.02 V at a speed of 2 mV/s in the negative direction, maintain at 1.02 V for 10 h, and afterwards, scan to 0.64 V at a speed of 2 mV/s in the negative direction, maintain at 0.64 V for 5 h, and finally, scan to 0.3 V at a speed of 2 mV/s in the negative direction and maintain at 0.3 V for 10 min, take out and soak in ultrapure water for 10 h to remove the residual electrolyte in pores so as to get the final nano-porous metal in the present invention, namely the nano-porous Au—Pt base material, FIG. 2 shows the photo of the as-prepared nano-porous Au—Pt sample in the size of 1.2 mm×1.2 mm×1.5 mm, which is black and free of cracks inside.

Figure 2:
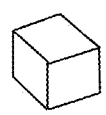
FIG. 2 is the photo of the bulk nano-porous Au—Pt material.
Figure 3:
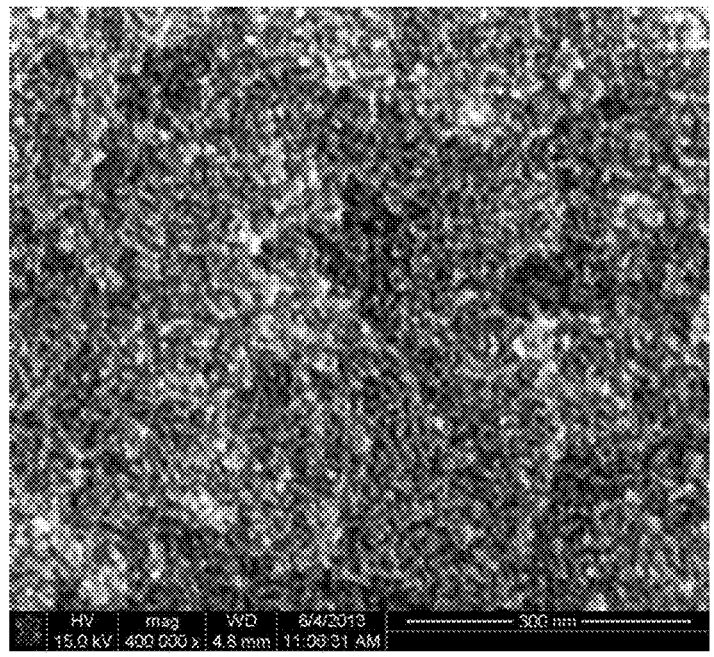
FIG. 3 is the photo of the microstructure on the cross-section of the nano-porous Au—Pt material of FIG. 2.

FIG. 3 is the scanning electron microscope image of the enlarged nano-porous Au—Pt section shown in FIG. 2. It is clear that the diameters of the pore wall and the pore are both around 6 nm.

Figure 4:
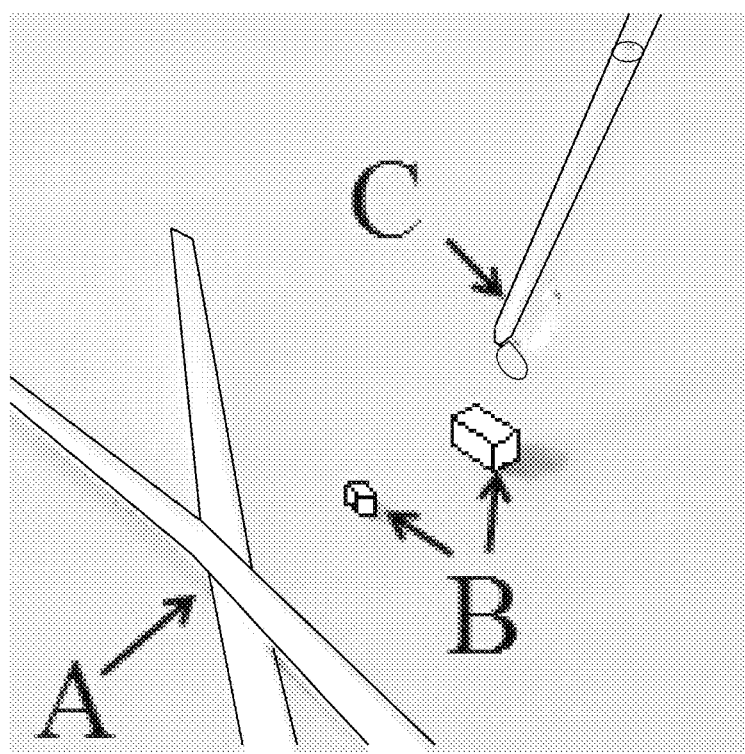
FIG. 4 shows the elements required by the nano-porous Au—Pt actuator driven on the basis of the surface tension of the liquid.

FIG. 4 shows the components required for preparing the nano-porous Au—Pt actuator driven by water: A is a filter paper strip, B is nano-porous Au—Pt sample and C is a dropper. Wherein, the filter paper strip is used to absorb part of water in the nano-porous Au—Pt so that the water content is less than the content of water that the nano-porous Au—Pt can contain; the sucker is used to add water into the nano-porous Au—Pt so that the water content is more than the content of water that the nano-porous Au—Pt can contain.

The nano-porous Au—Pt base prepared above is filled with water and than dried naturally.

Figure 5:
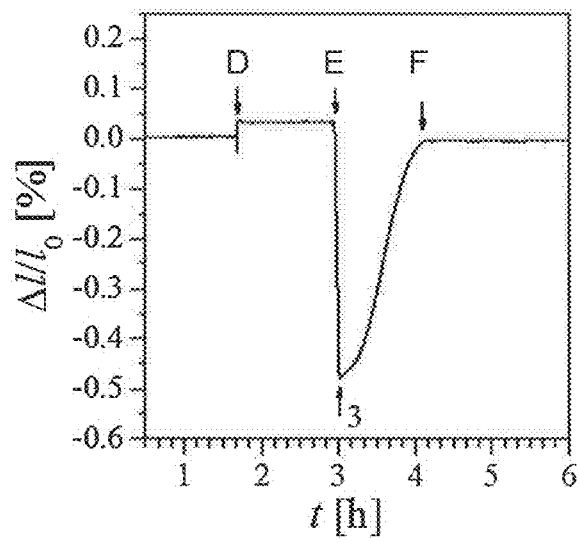
FIG. 5 shows the variation of the size of the nano-porous Au—Pt sample filled with water during drying along with time.

FIG. 5 shows the variation of the strain of the nano-porous Au—Pt sample in the direction of height during natural drying along with time. Before Point ED in FIG. 5, fully dry the nano-porous Au—Pt sample until no water is contained inside, and then add water into the nano-porous Au—Pt with the dropper at Point D so that water is fully filled inside, afterwards, naturally dry it in the air at room temperature. It can be seen that, the nano-porous Au—Pt begins to contract at Point E suddenly, and then the contraction value of the nano-porous Au—Pt arrives at the maximum limit after several minutes, namely at Point F in FIG. 5. The nano-porous Au—Pt slowly expands along with time and ends expansion after about 1 h. In fact, the nano-porous Au—Pt begins contraction at Point E in FIG. 5, where the water content becomes less than the content of water that the nano-porous Au—Pt can contain due to the loss of water caused during drying, and the liquid surface begins caving into the pores so that the nano-porous Au—Pt begins withstanding the compressive stress. At Point F, the compressive stress is the maximum and the contraction value is also the maximum. The transition from Point E to Point F actually corresponds the process from (a) to (b) illustrated in FIG. 1, namely, the fluid surface tension required for the nano-porous driver results in the contraction phase of the nano-porous material.

Figure 6:
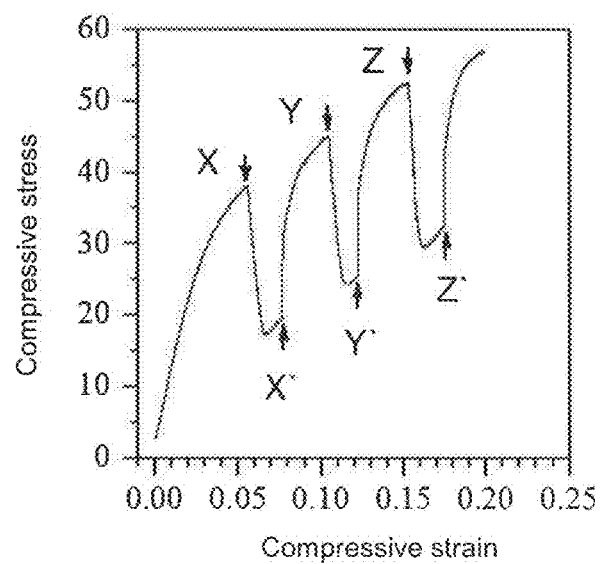
FIG. 6 shows the process of changing the additional pressure acting on the nano-porous Au—Pt by changing the content of water in the nano-porous Au—Pt.

FIG. 6 shows the variation of the additional compressive stress acting on the nano-porous Au—Pt caused by the water content in the nano-porous Au—Pt. In FIG. 6, the nano-porous Au—Pt sample in FIG. 2 is compressed along the height direction at a strain rate of $5\times10^{-4}$. At X, Y and Z, the water on the nano-porous Au—Pt surface is absorbed with the filter paper strip shown in FIG. 4, then the compressive stress decreases rapidly; at X', Y' and Z', water is added into the nano-porous Au—Pt with the dropper shown in FIG. 4, then the compressive stress rises rapidly. Since the strength of the nano-porous Au—Pt sample remains unchanged under a certain strain, the change of compressive stress caused by water absorption and addition is just resulting from the additional stress caused by the curved liquid-air interface in FIG. 1. This stress is the driving force of the contraction and expansion of the nano-porous Au—Pt. The driving force is as high as 23 MPa according to the figure. Moreover, it can be also concluded that, the yield strength of the nano-porous Au—Pt is about 40 MPa, and the maximum compressive stress applied by the liquid surface tension is 23 MPa, which leads to the deformation caused by the liquid surface tension to be purely elastic and ensures full reversibility of the actuation.

Figure 7:
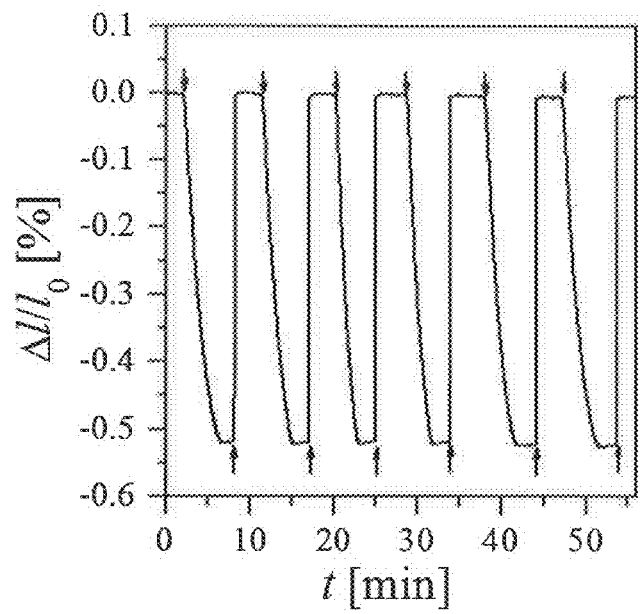
FIG. 7 shows the actuating performance of the nano-porous Au—Pt actuator driven on the basis of surface tension of water.

FIG. 7 is an example of the nano-porous Au—Pt driven by water. The upper arrow shows the removal of the water on the nano-porous Au—Pt surface with the filter paper strip, and the lower arrow shows the filling of water into the nano-porous Au—Pt with the dropper. As shown in FIG. 7, when the water on the nano-porous Au—Pt surface is absorbed, the nano-porous Au—Pt contracts rapidly, and reaches the maximum contraction value after several minutes; by adding water with the dropper, the nano-porous Au—Pt can expand to the original size within several seconds. Repeat this process, then the nano-porous Au—Pt can repeatedly contract and expand with the actuation amplitude high up to 0.53%.

Example 2

Figure 8:
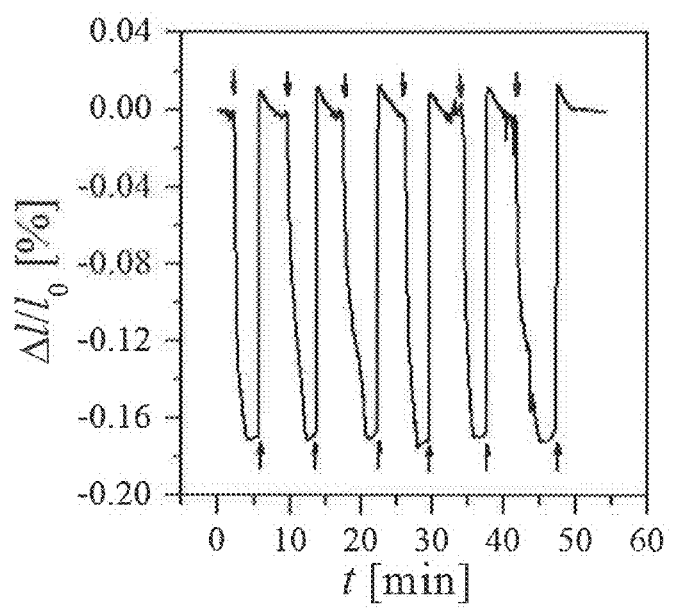
FIG. 8 shows the actuating performance of the nano-porous Au—Pt actuator driven on the basis of surface tension of alcohol.

The difference between this example and Example 1 lies in that, the filling liquid for the actuator in this example is alcohol in order to further indicate that nano-porous Au—Pt can be driven by liquids having different surface tensions. As shown in FIG. 8, the upper arrow shows the removal of the alcohol on the nano-porous Au—Pt surface with the filter paper strip, and the lower arrow shows the filling of alcohol into the nano-porous Au—Pt with the sucker. As shown in FIG. 8, when the alcohol on the nano-porous Au—Pt surface is absorbed, the nano-porous Au—Pt contracts rapidly, and reaches the minimum contraction value after several minutes; by adding alcohol with the sucker, the nano-porous Au—Pt can expand to the original size within several seconds. Repeat this process, then the nano-porous Au—Pt can repeatedly contract and expand with the actuation amplitude high up to 0.17%.

Example 3

Figure 9:
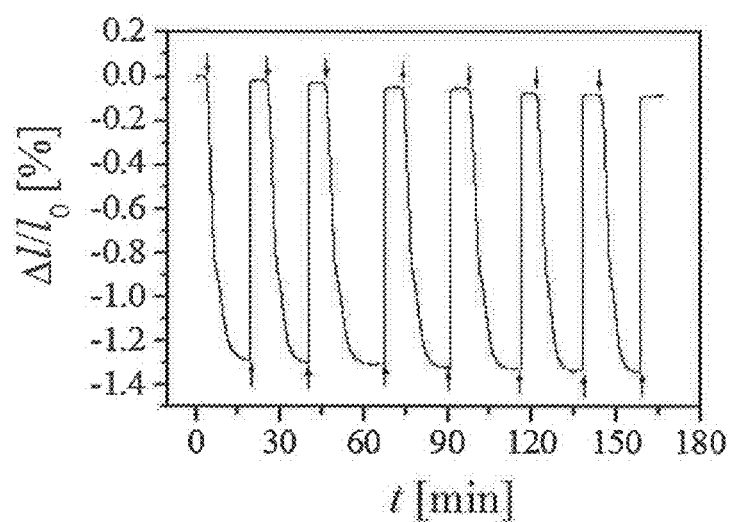
FIG. 9 shows the actuating performance of the nano-porous Au—Pt actuator driven on the basis of the surface tension of water, wherein the pore diameter of the nano-porous Au—Pt is about 58 nm, larger than the pore diameter of the nano-porous Au—Pt used in FIG. 4.

The difference between this example and Example 1 lies in that, in the example shown in FIG. 9, the pore diameter reaches 58 nm after the nano-porous Au—Pt sample obtained according to Example 1 is annealed at 390 V for 30 min. Namely, the change of the pore diameter of the nano-porous Au—Pt in the actuator in this example further indicates that the liquid-driven nano-porous actuator is suitable for various porous materials with different pore diameters. Repeat the process shown in FIG. 7, the actuation amplitude of the nano-porous Au—Pt is as high as 1.2%, and the response speed of strain is high up to 0.30%/s.

Example 4

Figure 10:
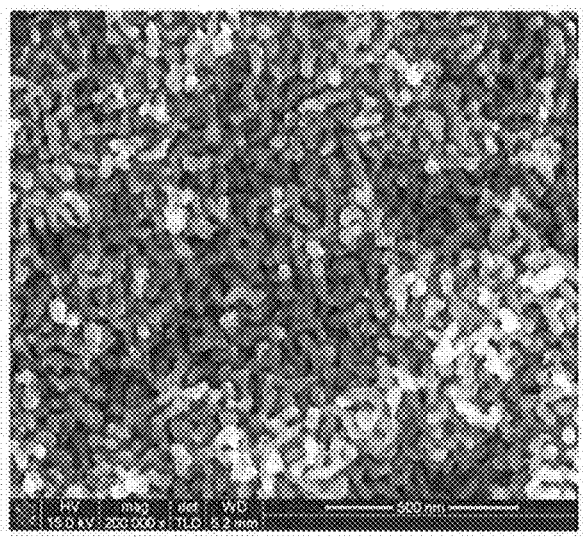
FIG. 10 is the photo of the microstructure on the cross-section of the nano-porous Au.

The difference between this example and Example 1 lies in that, the base of the liquid-driven nano-porous actuator is nano-porous Au, which indicates that the liquid-driven nano-porous actuator is suitable for various porous materials with different pore wall materials. The method for preparing the nano-porous Au base is as follows: prepare Au—Ag alloy with molar ratio of 25:75 by repetitive arc metling and then anneal the alloy ingot for 100 h at 850° C. for homogenization, compress it to 1.5 mm thick, and then cut to rectangular samples of 1.2 mm×1.2 mm×1.5 mm; afterwards, put the rectangular block samples of Au—Ag—Pt alloy on the working electrodes of a three-electrode system, control the electrochemical station to apply 1.05 V on the working electrodes to dealloy the alloy for 50 h. Wherein, the counter electrode in the three-electrode system is pure silver wires, the reference electrode is a saturated calomel electrode and the electrolyte is $HClO_4$ solution of 1 M. After dealloying, scan the potential applied on the working electrode to 1.35 V at a speed of 10 μV/s in the positive direction, and then scan to 0.75 V at a speed of 5 mV/s in the negative direction, maintain at 0.75 V for 5 min, next, take out and soak in ultrapure water for 10 h to remove the residual electrolyte in pores so as to get the final nano-porous metal in this example, namely the nano-porous aurum, afterwards, anneal the nano-porous aurum for 10 min at 200° C. to get the nano-porous Au sample in this example, wherein the photo of the microstructure is shown in FIG. 10, and the diameters of the pore wall and the pore are both about 25 nm.

Figure 11:
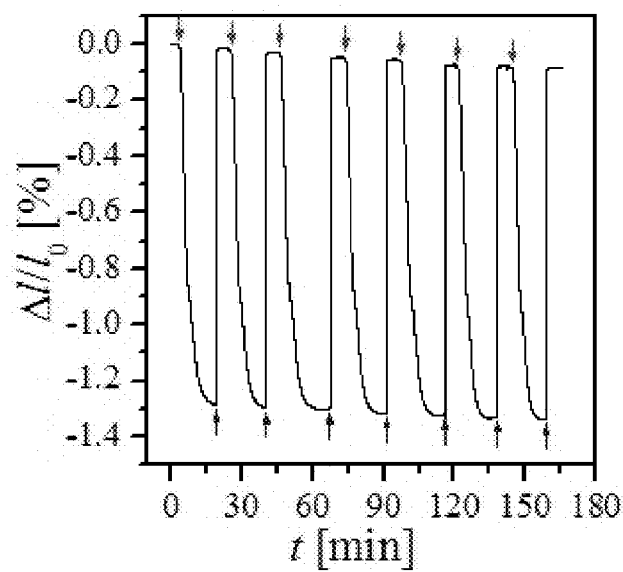
FIG. 11 shows the actuating performance of the nano-porous Au actuator driven on the basis of surface tension of water.

FIG. 11 is an example of the nano-porous Au driven by water. The sample used in FIG. 11 is the nano-porous Au sample prepared according to FIG. 10. Repeat the process shown in FIG. 7, then the actuation amplitude of the nano-porous aurum will be high up to 1.25%.

Example 5

Figure 12:
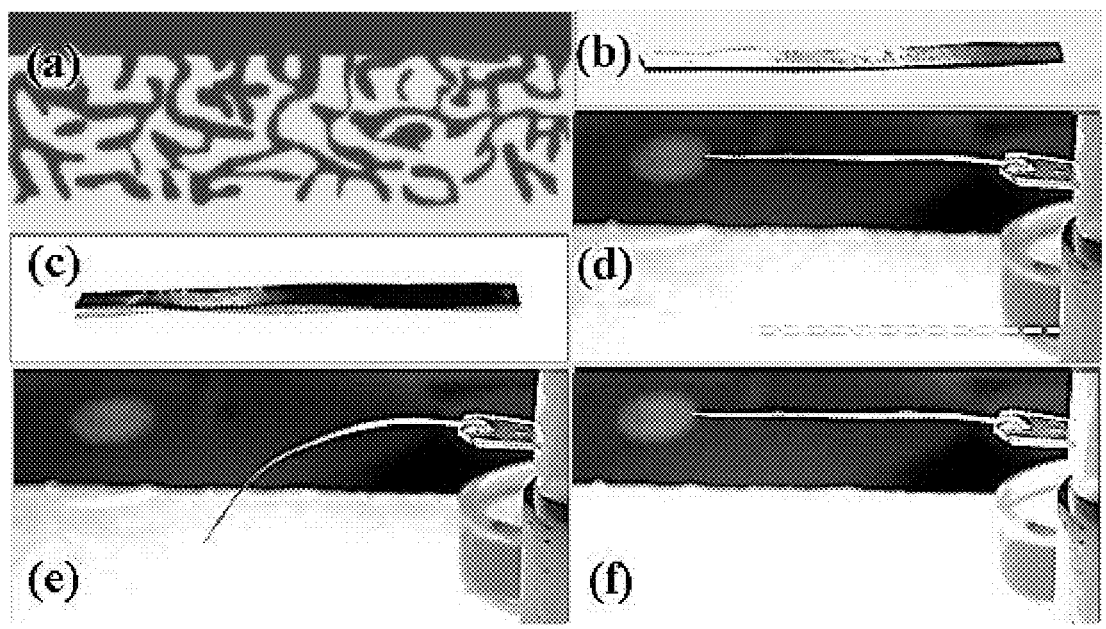
FIG. 12 shows the driving performance of the nano-porous Au/solid Ag bilayer composite structure driven on the basis of surface tension of water.

In the actuator according to this example, the base material is nano-porous Au/solid Asp bilayer strip consisted of nano-porous Au on one side and pure Au on the other side, and the filled liquid is water. This example is to further indicate that the nano-porous actuator devices driven by liquid can be made when part of the base material or structure is nano-porous structure. The bilayer structure of the nano-porous Au/Au composite structure consisted of nano-porous Au and solid Au is schematically shown in FIG. 12(a), wherein the upper part is solid Au and the lower part is nano-porous Au. This bilayer structure is prepared by the following method: protect one side of an Au—Ag alloy sheet of about 0.45 T×50 L×10 W (mm) with a AB adhesive, perform dealloying from the other side with the dealloying potential used being 1.045V, stop dealloying when half of the thickness is dealloyed, anneal at 400° C. for 2 h, and then anneal at 400° C. again after cold-rolling; repeat this process until the nano-porous Au is fully densified to form solid Au; the sample is about 0.12 mm at this time; cut off a strip of 50 L×3 W×0.12 T (mm) for dealloying, then the nano-porous Au/Au bilayer strip required for this example can be obtained after dealloying. FIG. 12(b) shows the solid Au side of the bilayer structure which is gold; FIG. 12(c) is the nano-porous Au side of the Mayer structure which is black. Its one end is fixed to form a suspension beam of 46 L×3 W×0.12 T (mm), wherein the Au layer is about 20 μm thick, and the nano-porous aurum layer is about 100 μm thick. FIG. 12(d) is the configuration when the nano-porous Au layer of the bi-metal sheet is filled with water. When the water on the surface is absorbed with the filter paper strip, the suspension beam bends downwards to what is shown in FIG. 12(e), and the bending in the direction vertical to the end is high up to 20 mm. When water is filled with the dropper, the suspension beam restores to what is shown in FIG. 12(f), consistent with the original state, namely what is shown in FIG. 12(d). The whole process can be repeated again and again and is fully reversible.

What is claimed is:

1. A liquid-driven nano-porous actuator, wherein said actuator comprises a base material and a liquid for driving; the base material is a fully or partly nano-porous material, and the pores in the nano-porous material are interconnected in 3D space; said liquid for driving is filled in the pores of the nano-porous material, and said nano-porous material and liquid share a contact relationship whereby a change in the content of the liquid in the nano-porous material results in the interface between the surface liquid of the nano-porous material and air being exchanged between flat and curved states, so as to change the compressive stress acting on the nano-porous material from the surface tension of the liquid and change the elastic deformation of the nano-porous material, and wherein the contact relationship further results in a driving of the nano-porous material into a contraction or expansion state in a reversible manner to provide the nano-porous actuator with a quality of driving performance.

2. The liquid-driven nano-porous actuator of claim 1, wherein the pore diameter of the nano-porous material is at the nanoscale.

3. The liquid-driven nano-porous actuator of claim 1, wherein the nano-porous material is selected from metal, ceramics, or polymer materials.

4. The liquid-driven nano-porous actuator of claim 1, wherein the nano-porous material has characteristics that result from being prepared by the following methods: electrochemical de-alloying method, chemical free corrosion method, metal anodization method, template method, solid sintering method, or sol-gel method.

5. A method of preparing the liquid-driven nano-porous actuator of claim 1, comprising providing the pore diameter of the nano-porous material and/or a surface tension of the filled liquid to achieve a predetermined driving force in the liquid-driven nano-porous actuator.

6. The liquid-driven nano-porous actuator of claim 5 wherein the liquid filled in the nano-porous material comprises water.

7. The liquid-driven nano-porous actuator of claim 6 wherein the nano-porous material comprises metal.

8. The liquid-driven nano-porous actuator of claim 1, wherein the liquid filled in the nano-porous material is water, alcohol, sodium nitrate, or metal melt.

9. The liquid-driven nano-porous actuator of claim 1, wherein, when the base material of the actuator is partly nano-porous material, an additional part of the base material is solid material.

10. The liquid-driven nano-porous actuator of claim 9, wherein the combination of the partly nano-porous and solid material is selected from a group consisting of a bilayer composite structure, a multi-layer composite structure, or a nano-porous shell-solid core composite structure.

11. The liquid-driven nano-porous actuator of claim 1, wherein the contact relationship resulting from the liquid filled in the nano-porous material results in a liquid wetting relationship with the pore wall of the nano-porous material and the contact relationship avoids any chemical interaction, chemical reaction or damage to the pore wall.

12. A method of assembling a device capable of exchanging between two shapes by changing liquid content and having memory effect, comprising connecting the liquid-driven nano-porous actuator of claim 1, as a first device component, to a second component of the device.

13. The method of claim 12, wherein the device is selected from the group consisting of an artificial muscle, a cardiovascular stent, or a tube connector.

14. A method of actuating a device having memory effect, the device comprising the liquid-driven nano-porous actuator of claim 1, and the method comprising altering a shape of the device between two shapes by changing a content of liquid in the nano-porous actuator.

15. The method of actuating a device according to claim 14 wherein the device is selected from the group consisting of an artificial muscle, a cardiovascular stent, or a tube connector.

16. The liquid-driven nano-porous actuator of claim 1 wherein the nano-porous material comprises metal.

17. A method of assembling the liquid-driven nano-porous actuator of claim 1 comprising combining the liquid and the base material.

18. The liquid-driven nano-porous actuator of claim 1, wherein the nano-porous material is sufficiently free of cracks as to enable the nano-porous actuator to bear external loads without damaging its structure and to repeatedly expand and contract without damaging its structure.

* * * * *